United States Patent [19]

Striedieck

[11] Patent Number: 4,784,169
[45] Date of Patent: Nov. 15, 1988

[54] APPARATUS FOR TREATING ARTICLES WITH SOLUTION TO REMOVE SOLIDS AND THEN FILTERING THE SOLUTION

[75] Inventor: Walter J. Striedieck, Port Matilda, Pa.

[73] Assignee: Chemcut Corporation, State College, Pa.

[21] Appl. No.: 23,981

[22] Filed: Mar. 10, 1987

Related U.S. Application Data

[63] Continuation of Ser. No. 570,459, Jan. 13, 1984, abandoned.

[51] Int. Cl.$^4$ .................. B08B 3/00; B01D 23/24
[52] U.S. Cl. ...................... 134/111; 134/10; 134/64 R; 210/108; 210/167; 210/313; 210/412; 156/642; 15/77
[58] Field of Search .............. 210/108, 167, 312, 313, 210/206, 408, 409, 411, 412, 523, 525; 15/77; 134/10, 104, 64 R, 111; 156/345, 640, 642

[56] References Cited

U.S. PATENT DOCUMENTS

| | | | |
|---|---|---|---|
| 2,440,134 | 4/1948 | Zademach . | |
| 2,652,841 | 9/1953 | Kurt | 134/111 |
| 3,049,135 | 8/1962 | Kuhl et al. | 134/111 |
| 3,083,718 | 4/1963 | Heinicke | 134/111 |
| 3,112,263 | 11/1963 | Ellila | 210/411 |
| 3,357,567 | 12/1967 | Wake | 210/411 |
| 3,566,429 | 3/1971 | Hamilton | 15/77 |
| 3,776,800 | 12/1973 | Goffredo et al. | 156/345 |
| 3,928,064 | 12/1975 | Holm | 15/77 |
| 3,946,454 | 3/1976 | Holm et al. | 15/77 |
| 4,015,706 | 4/1977 | Goffredo et al. | 198/861 |
| 4,025,363 | 5/1977 | De Santis | 134/102 |
| 4,213,863 | 7/1980 | Anderson | 210/108 |
| 4,412,920 | 11/1983 | Bolton | 210/409 |
| 4,427,019 | 1/1984 | Eidschun | 134/104 |
| 4,431,541 | 2/1984 | Lee | 210/393 |

FOREIGN PATENT DOCUMENTS

3019143 11/1981 Fed. Rep. of Germany .

*Primary Examiner*—Benoît Castel
*Attorney, Agent, or Firm*—Paul & Paul

[57] ABSTRACT

Apparatus is provided for treating articles, such as printed circuit boards and the like, by removing solid particles, such as polymer resists, by a chemical action such as a stripping action, with the chemical action being provided by spraying a solution onto the articles. The removed particles are then separated from the solution, by novel separation apparatus, so that the solution can be re-used. The novel separation apparatus employs one or more screens or filters that are angularly disposed to allow solution to fall through the screen or screens, and solution is provided in such a manner as to wash along or across the screen or screens, to wash particles into a residence zone, from which they may be evacuated. The particles are preferrably propelled from the residence zone on a periodic basis, for subsequent filtration, whereby the solution in which they are carried may likewise be returned for re-use.

13 Claims, 4 Drawing Sheets

APPARATUS FOR TREATING ARTICLES WITH SOLUTION TO REMOVE SOLIDS AND THEN FILTERING THE SOLUTION

This is a continuation of Ser. No. 570,459 filed on Jan. 13, 1984 and now abandoned.

BACKGROUND OF THE INVENTION

This invention arises out of the electronic industry, and more specifically out of the industry that has built up for manufacture of printed circuit boards, printed circuit film, and the treatment of like articles. In this industry, and related fields, such as the electroplating industry, it has become commonplace that where an article is to be treated, if there are portions of the article that are not to be treated, such as by etching, plating, or the like, a barrier will be provided to those portions that are not to be treated, in the form of a coating of material which is later to be removed. Typically, where plating or etching are the treatments involved, the coating will be in the form of a mask that is applied to the printed circuit board or other article, which mask prevents the treatment fluid, generally liquid, from having any chemical effect such as etching or plating on the article in those locations where the mask is applied. This is because the mask is generally selectively applied to only those portions of the article that are not to be treated. After the etching, plating, or the like is accomplished, the mask is then chemically treated by applying a solution to it that chemically removes it from the article. Typically, such a solution is an acidic or alkaline solution that breaks down and separtes the mask from the article, often while it is being conveyed through a solution-spraying chamber.

In the past, many such chemical solutions that remove the masks, coatings, or the like, have been chemically structured to dissolve the mask in the solution. When this has been the case, the material of the mask can build up in the solution until it reaches an unacceptably high concentration, in which case the solution can either be discarded or subjected to a subsequent reclamation operation. In the past, many such masks have been of a water-soluble type that have lent themselves to being discarded into sewage systems, along the with solutions.

Increased environmental concern has lead to the development of other masks or coatings, including some that are not water-soluble, such as polymers and the like, including masks that are also not soluble in the solutions that are used to remove them from the underlying articles such as printed circuit boards or the like. Thus, while the chemistries that are used to separate the polymers or other masks from boards or other articles are able to quickly remove the masks from the articles, they leave the removed material often in a range of physical states ranging from a gelatinous consistency, to particles such as relatively inert flakes or skins, which may remain in the solution almost indefinitely without dissolving.

With the increased development of the electronic industry, an ever-increasing demand has been placed on the development of article treatment apparatus that is capable of highspeed automatic processing, particularly for printed circuit boards and the like. This necessarily produces a demand for high processing rates for the management of skins and debris that result from removing etching and plating resists or masks from panels. This necessarily results in demand for higher processing rates with respect for removal of accumulated residue from the solutions that have been used to remove the masks from articles.

In the past, in most filtration situations, the filtrate or filter cake is permeable, which enables the filter action to continue, until the aggregate accumulation of the filtrate slows down the liquid passage to an inefficient level. For example, in U.S. Pat. No. 3,776,800, a removable filter is taught, as is used for removing particles from an etching solution. Also, the removable of resists and other masks from articles being treated is taught in U.S. Pat. No. 4,015,706, as some of the treatment functions to which the present invention is addressed.

In the case of some masks or resists, particularly when they are polymers, the presence of the skins, flakes, etc., which comprise the polymer or other mask, because of their ability to attach themselves to the screen or other filter, may render the screen or other filter inoperable, by sealing or clogging the screen or other filter.

THE PRIOR ART

Where particle separation from liquids is desired, it is known to employ certain forms of self-cleaning screens or filters, such as by vibrating the screens or filters to remove particles from them, by reverse flow techniques, or by interrupted operation to allow for aggregate particle removal, in general.

THE PRESENT INVENTION

The present invention is directed to an apparatus for treating various articles, including printed circuit boards, for removing a mask or resist, or other coating therefrom, and to facilitate reclaiming of the solution that chemically effects the removal. To this end, a separation apparatus is provided, including one or more screen filters that allow substantially particle-free solution to pass through the filter or screen, at the same time washing the screen to keep particles, flakes, etc. from accumulating in the pores of the screen or filter, and then collecting the particles thus washed from the screen or filter, preferably in such a manner as to allow for a subsequent periodic filtration, whereby the particles may be sufficiently filtered from a small portion of the collected treatment solution that the solution is adapted for re-use, while the major portion of the treatment solution is substantially immediately ready for re-use.

SUMMARY OF THE INVENTION

The present invention is directed to providing an apparatus for chemically removing particles of solid matter from a treatment liquid, wherein the solid matter originates from articles being treated by the chemical treatment liquid. The removal is provided by a separation technique that employs a filtering of the treatment liquid through angularly disposed filter plates or screens that allow the passage of falling solution therethrough, while trapping particles which are then washed from the screen and collected, preferably for subsequent filtration from the washing liquid, which is also preferably the treatment liquid.

Accordingly, it is the primary object of this invention to provide a novel apparatus for chemically removing solid matter from articles being treated.

It is another object of this invention to provide such an apparatus, in which separation is provided for particles, debris, flakes, etc., that are present in the treatment liquid as a result of the removal of the solid matter from the articles.

It is another object to accomplish the above objects, wherein particularly novel separation apparatus allows for flow of the treatment liquid through a filter medium, and wherein the entry surface of the filter medium is washed for collection of the particles therefrom.

It is another object of this invention to accomplish the above object wherein the collection of particles is periodically actuated, with facility for thereafter further separating treating liquid from particles, for reuse of that liquid.

It is another object of this invention to accomplish the above objects wherein the apparatus is particularly adapted for treating printed circuit boards, film and the like by removal of mask, resist, coatings or the like, by a chemical solution such as a resist stripping solution, by means of spraying the solution on articles while articles are being conveyed along a path.

It is another object of this invention to accomplish the above objects, wherein one or more screens are utilized, together with screen-washing conduits for collecting debris, and for subsequently evacuating the debris from a collection zone.

It is another object to concentrate the particulate thereby rendering it more manageable.

Other objects and advantages of the present invention will be readily apparent to those skilled in the art by a reading of the following brief descriptions of the drawing figures, detailed descriptions of the preferred embodiments, and the appended claims.

BRIEF DESCRIPTION OF THE DRAWING FIGURES

DETAILED DESCRIPTION OF THE PREFERRED EMBODIMENTS

Figure 1:
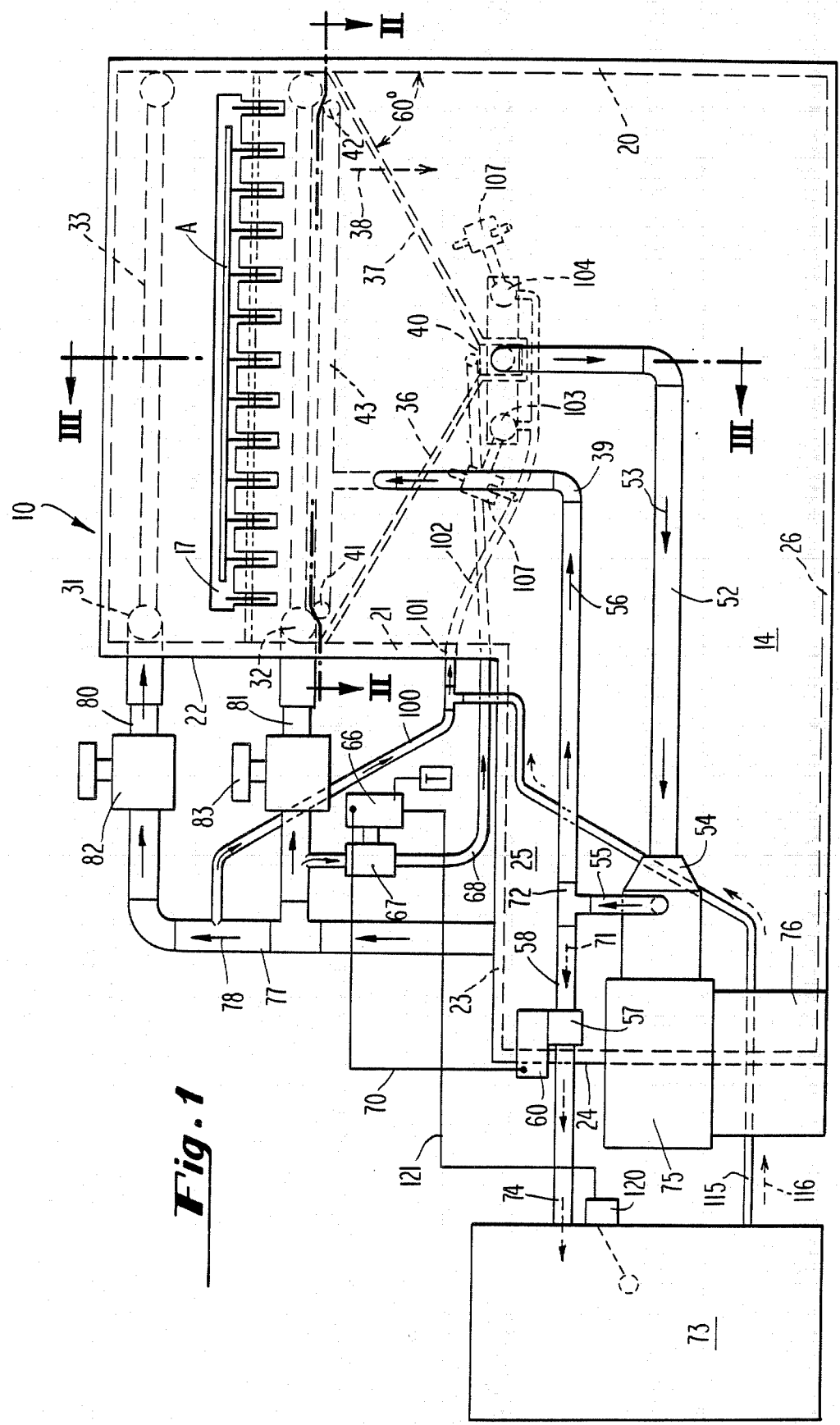
FIG. 1 is an end elevational view of a resist stripping apparatus in accordance with this invention, looking in the direction of article flow of the apparatus, and wherein most of the solution-handling conduits are illustrated.
Figure 2:
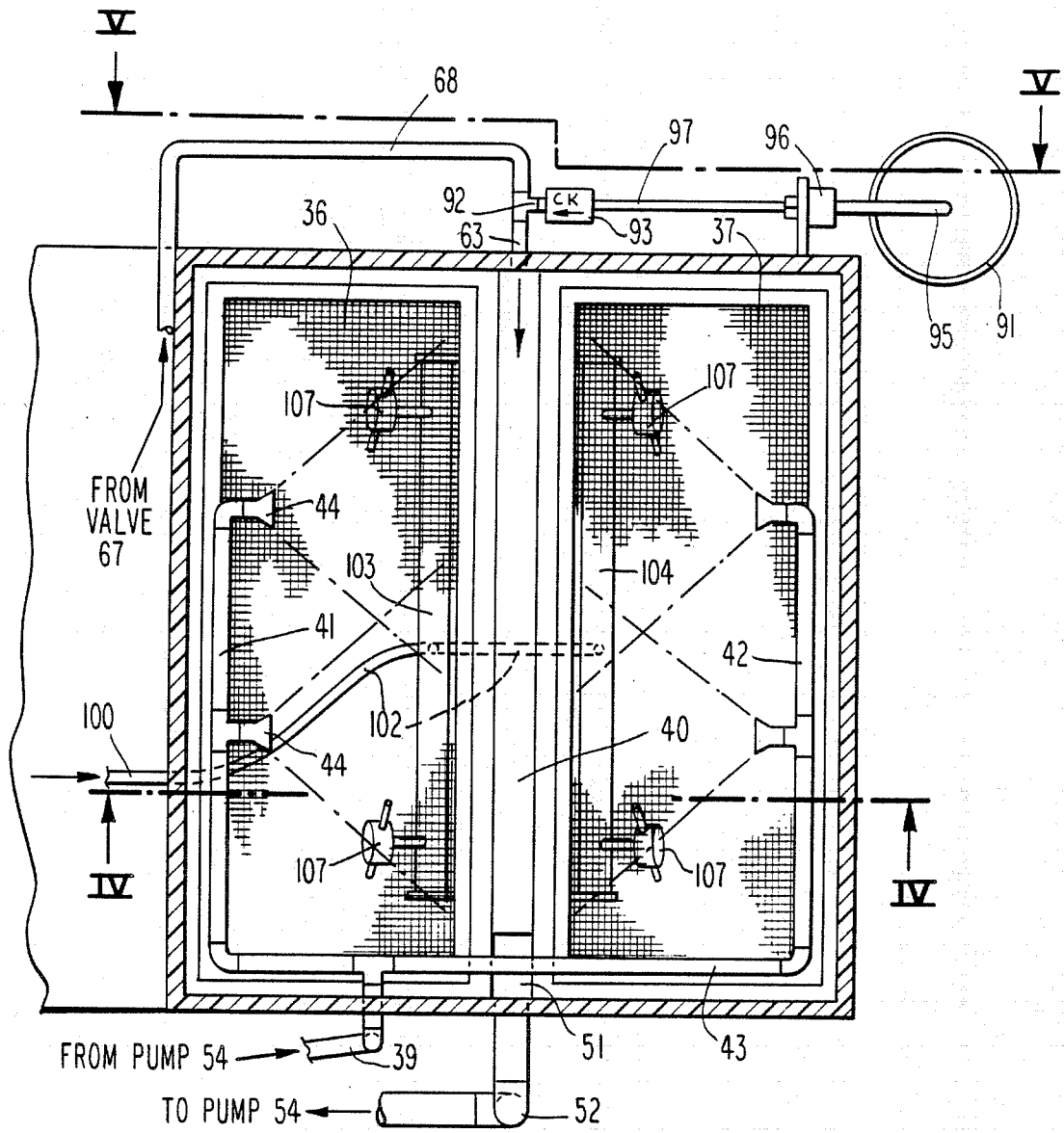
FIG. 2 is a fragmentary horizontal sectional view taken through the apparatus of this invention, generally along the line II—II of FIG. 1, and wherein various separation features of the present invention are more clearly illustrated.

Referring now to the drawings in detail, reference is first made to FIG. 1, wherein the apparatus for removing mask, resist or the like from printed circuit boards, printed circuit film, or the like, as an adjunct to an etching, plating or other chemical treatment apparatus, is generally designated by the numeral 10.

The apparatus 10 includes a chamber 11 having an interior 12, with an upper portion 13 and lower portion 14. The chamber 11 is defined by inlet and outlet endwalls 15 and 16, with respectively associated inlet and outlet openings 17 and 18 respectively. Sidewalls 20 and 21 define the sides of the chamber, except that an extended sump section is provided on the far side 22 of the apparatus 10, defined in part by a horizontal chamber wall 23 and a vertical chamber wall 24. The extended sump section is identified by the number 25, beneath the wall portion 23. The chamber is provided with a bottom 26 and a removable lid 27.

Figure 3:
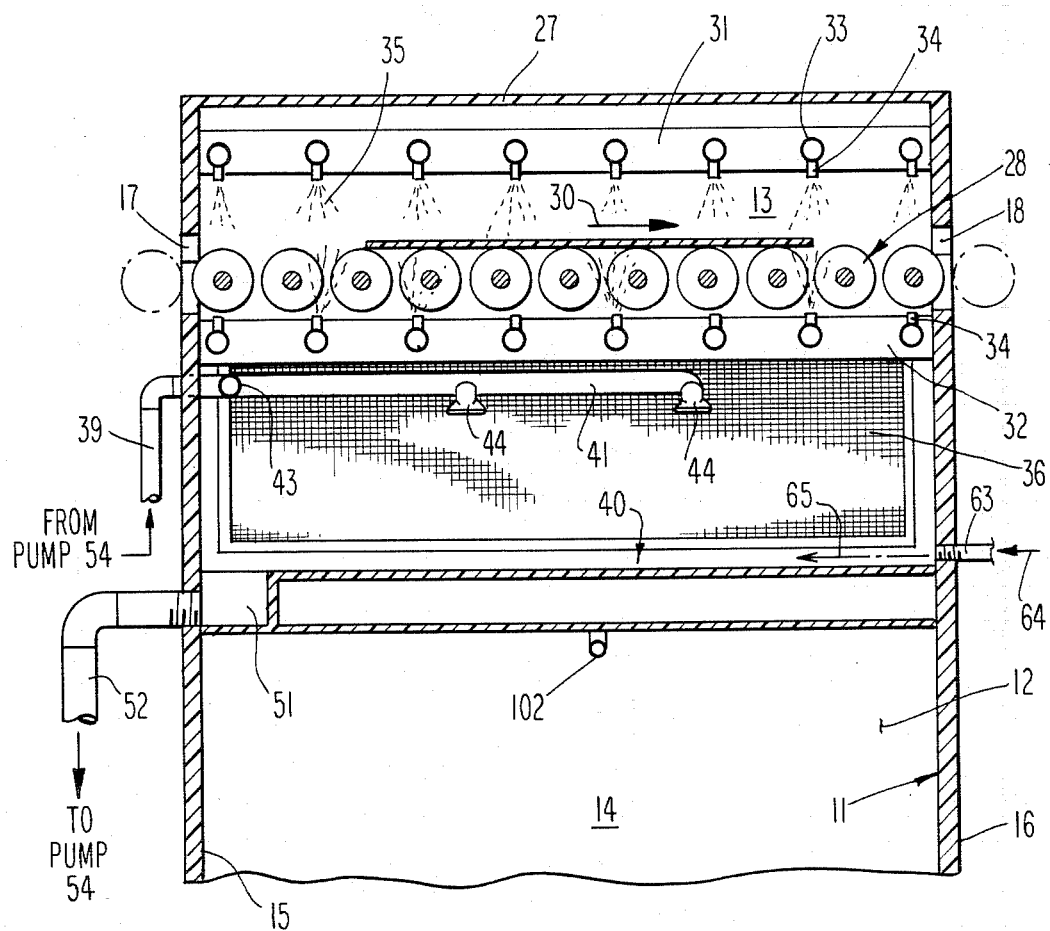
FIG. 3 is a fragmentary vertical sectional view taken through the apparatus of this invention, generally along the line III—III of FIG. 1.

A conveyor apparatus 28, in the form of conveyor rods and wheels similar to those disclosed in U.S. Pat. Nos. 4,015,706 and 4,046,248, is utilized, preferably also similarly driven to the conveyor drive techniques disclosed in those said patents, and the disclosures thereof are herein incorporated by reference. Also, the apparatus 10 may be constructed in modular form to engage at its end with next adjacent modules, in the manner set forth in said two immediately above-mentioned patents, by similar connection, alignment, and drive connecting techniques, so the same will not be duplicated herein. In any event, the conveyor apparatus 28 is adapted to convey a printed circuit board or other article A therealong, as indicated in FIG. 3, in the direction of the arrow 30 in FIG. 3.

Upper and lower spray headers 31 and 32, respectively, each with a plurality of spray pipes 33 extending transverse of the apparatus, deliver treatment liquid to spray nozzles 34. The spray nozzles 34 are arranged to spray the chemical treatment liquid as at 135, onto the articles A as they pass therebetween, which chemically loosens the resist or other coating from the articles A and washes it off the articles A to pass with the treatment solution, downwardly to a pair of filter screens 36 and 37.

The filter screens 36 and 37 form part of the separation feature, for separating particles that have been removed from the articles A. The screens 36 and 37 are angularly mounted as shown in FIG. 1 to be at a sufficiently acute angle with the vertical (preferably 60 degrees) to allow for passage of substantial amounts of treatment liquid therethrough, as the treatment liquid falls downward in the direction of arrow 38 of FIG. 1. Naturally, the porosity of the screens 36 and 37 will be selected in accordance with the expected particle size for a given removal operation. Suitable mounts are provided for the screens 36 and 37, to hold them in the preferred orientation, as shown, in a V-configuration, with the screens on each side converging toward a trough 40.

Figure 4:
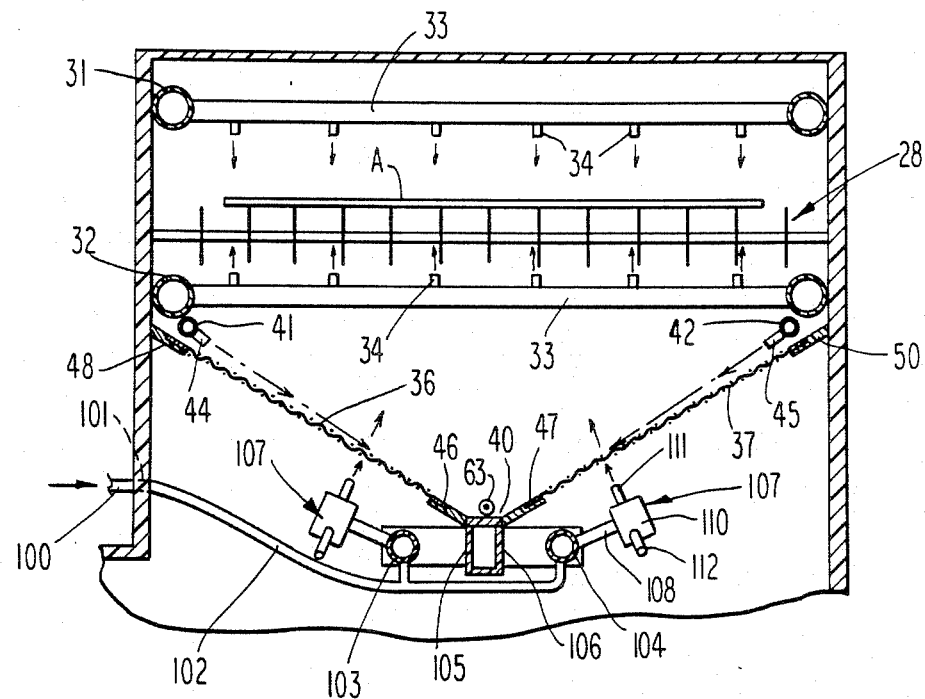
FIG. 4 is a fragmentary vertical sectional view taken through the apparatus of this invention, generally along the line IV—IV of FIG. 2, and wherein the screen washing and reverse flow features are more clearly illustrated.

A pair of washing spray headers, as shown in FIG. 4, are provided with the same treatment liquid that effect the chemical removal, via a delivery line 39 and a suitable interconnecting conduit 43. The headers 41 and 42 carry respectively associated spray nozzles 44 and 45, oriented for spraying along or across the screens 36 and 37, in the manner illustrated in FIG. 4 for washing flakes, skins, or other particles that have been removed from the articles being treated, such spraying effecting the delivery of such particles into the trough 40. The return of solution, such as via line 39, is important because it prevents accumulation of particles in trough 40 which might otherwise build up in trough 40 and on screens 36 and 37 where such particulate could otherwise clog the screens.

The trough 40 is formed by the lower mounts 46 and 47 of the screens 36 and 37. The screens 36 and 37 likewise have upper mounts 48 and 50.

It will thus be seen that debris that is washed from the screens 36 and 37 will accumulate in the trough 40, which extends essentially the length of the apparatus and between opposed endwalls 15 and 16, as shown in FIG. 3, but that the washing liquid (treatment liquid) is free to pass outwardly from the left-most end of the trough 40 as viewed in FIG. 3, into liquid well 51 and out via exit line 52 in the direction of arrow 53 of FIG. 1, to a centrifical pump 54. The pump 54 is generally continually operating, and pumps the treatment liquid thus conveyed to it, via line 55, back to the headers 41 and 42 via line 39, in the direction of the arrow 56 indicated on FIG. 1.

It will be noted that a valve 57 in line 58, operated by means of a solenoid 60, is in the closed position, during such flow of treatment liquid to well 51 and through the pump 54 as aforesaid, such that the flow of the liquid cannot at this point in the operation, go through line 58, such that the liquid will be returned via line 56 as shown in FIG. 1.

As aforesaid, particles, debris and the like will accumulate in the trough 40 for a pre-set time, or until a pre-set condition occurs. Such a condition could be the rise of liquid level in the trough 40 that is operative to trigger the evacuation of the trough, but preferably it will be the passage of a given period of time, such as a predetermined number of seconds, as controlled by a suitable timing device T. In any event, according to preset parameters, the evacuation of the trough 40 will be effected by delivery of a surge of treatment liquid in the direction of arrow 64 of FIG. 3, to conduit 63, in a form of a propulsion means, to propel accumulated debris in the trough, from its right end, as viewed in FIG. 3, in the direction of arrow 65, to the left end, into well 51, and out via line 52 to the pump 54. Substantially simultaneously with the actuation of the timing device T that controls the sudden flow through line 63, the timing device T will also, operating either through the solenoid 66 that controls the valve 67 that causes the flow through line 63 via line 68, or otherwise, will also actuate the solenoid 60 via electric line 70, to open the valve 57 whereby the discharge of the treatment liquid that includes the debris just evacuated from the trough 40, upon passing through the tee 72, in line 55, will go leftward as viewed in FIG. 1, via line 58, in the direction of arrow 71, taking the shortest path having the least resistance to deliver the debris and treatment liquid from the trough 40 to a filter apparatus 73 via line 74. The propulsion of treatment liquid from line 63 is also timed by the timer T, to last for a pre-set duration, at which point the timer T will effect the closing of the valve 67 through solenoid 66, and substantially simultaneously therewith the actuation of the solenoid 60 will cause the valve 57 to close, all of which will occur after sufficient term has passed as is pre-set into the timer T, for the evacuated solids and treatment liquid from trough 40, to have passed through the pump 54. Thereafter, the discharge from the pump 54 will return via line 56 to headers 41 and 42.

It will be understood that the pump 54 is driven from any suitable motor 75, suitably mounted at 76.

It will also be understood that the treatment liquid that passes through the screens 36 and 37 is collected at a lower portion of the chamber 14 and passed to a main pump (not shown) in the extended sump portion 25 of the lower portion of the chamber 14, for recirculation of the treatment liquid up through main delivery line 77, in the direction of arrow 78 of FIG. 1, to the main delivery lines 80 and 81 that feed upper and lower spray headers 31 and 32, respectively. It will also be noted that the lines 80 and 81 are each provided with suitable flow controls 82 and 83, generally in the form of manually adjustable valves of the like.

Figure 5:
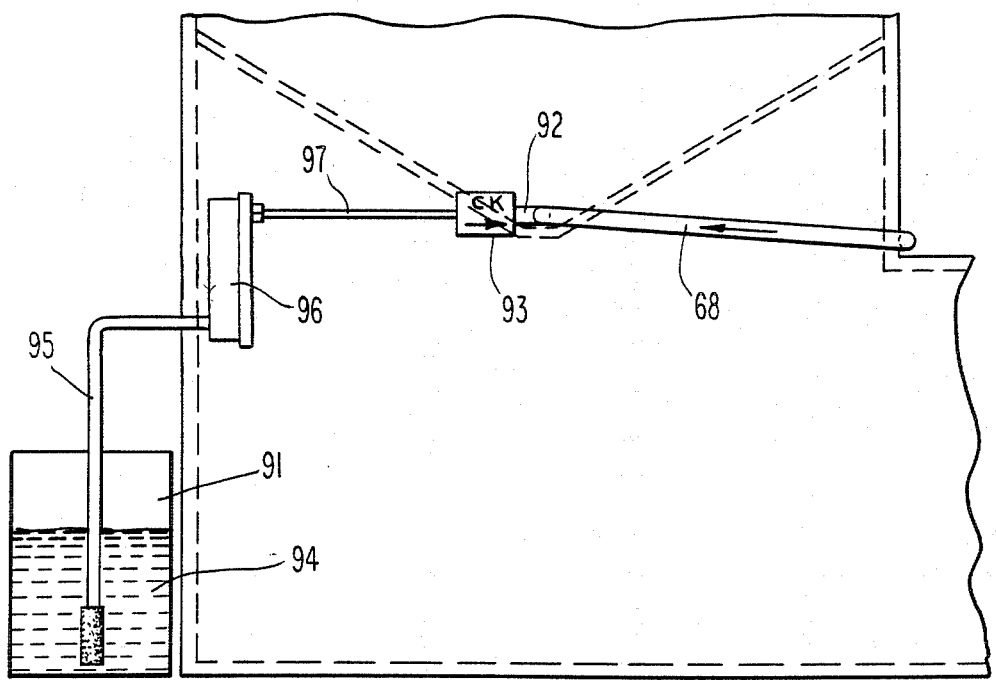
FIG. 5 is a fragmentary vertical elevational view of the apparatus of this invention taken generally along the line V—V of FIG. 2.

With reference to FIG. 5, it will be noted that the line 63 which delivers the high volume propulsion in the form of treatment liquid to the trough 40, also povides an anti-foam agent from anti-foam supply 91, preferably by creating a partial vacuum at the location of junction of conduit 92 with line 63, which draws the vacuum through a one-way valve or check valve 93 (to prevent liquid flow leftward through the valve as viewed in FIG. 5), to draw anti-foam liquid agent 94 from container 91, up through line 95, through flowmeter 96, through line 97, and through check valve 93, by means of partial vacuum or venturi action, to deliver the anti-foam agent into the trough 40 with the treatment liquid that serves as the propulsion for evacuating the trough. This is to prevent foaming upstream of the pump 54 while the pump is handling the debris, particles or the like, so as to prevent pump cavitation.

The apparatus for effecting the separation of removed particles from the treatment liquid in accordance with this invention is also provided with an optional reverse flow feature. This feature resides in the delivery of treatment fluid to the reverse or lower sides of the screens 36 and 37, in a manner that causes a vibration of the screens, and which also delivers liquid to the screens, in an upward direction, which helps wash particles, debris and the like from the upper surfaces of the screens, downward into the trough 40. The manner in which the reverse flow is provided is through line 100, supplied from main recirculation line 77, to an inlet port 101 into the interior of the chamber (FIGS. 1 and 4), where flexible tubing 102 delivers the treatment fluid to delivery headers 103 and 104. The delivery headers 103 and 104 are mountedly carried at 105 and 106, respectively, by any suitable techniques, beneath the trough 40, and in turn, carry rotatable spray devices 107. Spray devices 107 are each substantially identical in construction, so only one need be described in detail.

Each spray device 107 is mounted on a liquid flow conduit 108 which receives treatment liquid from its appropriate header 103 or 104 and delivers it to a rotating head 110. The rotating head 110 is rotatably driven by the reaction pressure of the treatment liquid passing therethrough and serves to rotate the head 110 and the spray nozzles 111 and 112 carried thereby, whereby treatment liquid is sprayed from the nozzles 111 and 112, in moving arcs, which effectively sprays substantially the entire underneath of the screen 36 and 37 (from all eight nozzles of the four heads 110), to effect the reverse flow washing of particles through the screens 36 and 37.

With reference to FIG. 1, it will be noted that the filter 73 is provided with a treatment fluid discharge line 115 for passage of treatment fluid that has been cleansed by filtering of the residue from the trough therefrom, which filtering occurs within the filter 73, and this filtered treatment fluid is then delivered via line 115, in the direction of arrow 116 back into the chamber, through inlet 101. It will be understood that, the flow of fluid through line 100 is a partial vacuum or venturi effect in line 115 for returning the filtered fluid into the chamber. It will also be understood that, in the event that the reverse flow feature of this invention is not to be utilized, such that the spray heads 107 will not be provided with liquid via line 102, then treatment liquid may either continually be provided via line 100 into the chamber through opening 101 in order to effect the venturi action for returning filtered liquid from the filter 73 via line 115, or in the alternative, opening 101 can be modified for direct discharge into the sump.

The filter 73 will generally be provided with a removable filter basket (not shown) that will gradually accumulate debris until it forms a substantially dense cake, at which time it will require manual removal. Such can be checked periodically, such as daily, depending upon the experience of the operators, and the filter basket may either be replaced, or merely dumped for re-use. In the event that the filter 73 is not checked, and the debris builds up in the filter chamber 73, such that filtering action no longer takes place and liquid build-up is effected, a suitable level-responsive level control 120 may be actuated to supersede the solenoid actuation of the valve 67, by means of line 121, whereby evacuation of the trough 40 by delivery of treatment fluid through line 63 may be overriden, to prevent pumping of additional debris, particles and the like, along with treatment liquid, from pump 54 to the filter 73 via line 74, until the discharge of the filter apparatus 73 may be effected.

In accordance with the above invention, it will be noted that various modifications may be made in different features, within the purview of the invention as recited in the appended claims. For example, while an angle of 30 degrees slope (with the horizontal) for the screens 36, 37 has been found to be preferable to permit sufficient liquid passage therethrough, it will be apparent that different angles may also work reasonably well. Additionally, it will be apparent that while screens 36, 37 are the preferred type of separtion filter at that location, other filtration devices that are not technically screens, may also be used. It will further be apparent that various other details and operations of the device of the present invention may be modified within the spirit and purview of the claims.

It will thus be seen that the present invention seeks to prevent coating and consequent filling of filter screens, such as has been a disadvantage of previous approaches. The present invention is particularly useful where the masks or coatings that are being removed are polymers, which have a potential to collect and dry on the filter surface, and the present invention addressed this by placing the screens in the processing chamber, where they may receive a large flow, for example, 40 gallons per minute of solution to wash the screens and maintain them free of collected debris, and which flow will also keep the screens from drying out which might also otherwise cause the polymer to adhere to the filter medium, in instances where polymers are used.

What is claimed is:

1. An apparatus for chemically removing solid matter from articles being treated by a chemical treatment liquid and filtering from the treatment liquid the solid matter thus removed, said apparatus including a treatment chamber, article supporting means in an upper portion of said chamber for supporting articles being treated, means for delivering treatment liquid to spray means in said chamber for spraying onto articles supported therein for removal of solid matter from articles by the spray of the treatment liquid and collection means at a lower portion of said chamber for collecting treatment liquid for recycling to said delivery means, said apparatus including:

(a) separating filter means disposed at a sufficiently acute angle to the vertical to allow falling treatment liquid to pass therethrough and to allow solid matter not passing through the filter means to be washed along the filter means;
   (b) filter washing means for delivering treatment liquid across said filter means for washing solid material therealong;
   (c) a residence zone at a lower end of said separating filter means for receiving solids washed along the filter means, and distinct from said collection means; and
   (d) evacuation means for evacuating an evacuate of treatment liquid and solid material from said residence zone;

wherein said residence zone for receiving solid material and treatment liquid is defined by having a discharge line connected thereto comprising means for receiving treatment liquid flowing into said residence zone and delivering said liquid to means for recycling it back to the upper portion of said chamber, and wherein said evacuation means includes propulsion means for delivering a stream of treatment liquid through said residence zone to evacuate accumulated solid material therefrom.

2. An apparatus for chemically removing solid matter from articles being treated by a chemical treatment liquid and filtering from the treatment liquid the solid matter thus removed, said apparatus including a treatment chamber, article supporting means in an upper portion of said chamber for supporting articles being treated, means for delivering treatment liquid to spray means in said chamber for spraying onto articles supported therein for removal of solid matter from articles by the spray of the treatment liquid, and collection means at a lower portion of said chamber of collecting treatment liquid for recycling to said delivery means, said apparatus including:

(a) separating filter means disposed at a sufficiently acute angle to the vertical to allow falling treatment liquid to pass therethrough and to allow solid matter not passing through the filter means to be washed along the filter means;
   (b) filter washing means for delivering treatment liquid across said filter means for washing solid material therealong;
   (c) a residence zone at a lower end of said separating filter means for accumulating solids washed along the filter means, and distinct from said collection means; and
   (d) evacuation means for evacuating an evacuate of treatment liquid and and solid material from said residence zone, wherein an additional filter means is provided, connected to said means for receiving the evacuated and filtering solid material from the treatment liquid therein wherein said residence zone is defined by a trough for receiving solid material and treatment liquid, with the trough having a discharge line interconnecting said trough with the upper portion of said chamber for receiving treatment liquid flowing into the trough and recycling it back to the upper portion of said chamber, and wherein said evacuation means includes propulsion means for periodically delivering a stream of treatment liquid through the trough to evacuate accumulated solid materials therefrom, and wherein the evacuation means further includes a discharge conduit from said trough, with valve means in said discharge conduit, and with means operationally connecting said valve means and said propulsion means whereby upon actuation of said propulsion means there is substantially simultaneously effected a setting of said valve means from a position of normal flow between said discharge line and said chamber, to an alternate position of flow between said discharge conduit and said additional filter means, whereby accumulated solid material is delivered, by way of said discharge conduit, to said additional filter means.

3. The apparatus of claim 2, including reverse flow means located in said chamber beneath said separating filter means, with means for supplying the reverse flow means with treatment fluid, and wherein said reverse flow means includes treatment liquid discharge means for discharging treatment liquid against the underside of said separating filter means to facilitate washing of solid material therefrom.

4. An apparatus for treating printed circuit boards, film and like articles having portions with polymer resist that is to be removed as solids by means of a resist stripping solution by spraying the solution on articles while the articles are conveyed along a path and filtering from the stripping solution the resist thus removed, wherein the apparatus comprises a treatment chamber, article conveying means in the chamber for conveying articles form an opening at one end to a discharge at the other end, spray nozzles in the chamber and disposed for spraying the stripping solution on the articles, and a collection zone in the chamber for collecting the stripping solution for recycling to said nozzles; said apparatus including:
 (a) at least one screen disposed at a sufficiently acute angle to the vertical to allow falling solution to pass therethrough while screening out resist particles and to allow the resist particles not passing through at least one screen to be washed along at least one screen;
 (b) at least one screen washing nozzle and being disposed generally at the upper end of at least one screen and washing resist particles along at least one screen;
 (c) a trough at the lower end of at least one screen, separate from said collection zone, for accumulating particles and solution washed along at least one screen; and
 (d) evacuating means connected to said trough, for evacuating solution and particles from said trough, including a filter connected to said evacuation means, for receiving the solution and particles from the trough, with the trough having a discharge line interconnecting said trough and chamber for delivering solution from the trough to means for returning said solution back to the chamber, and wherein said evacuation means includes propulsion means for periodically delivering a sufficient stream of solution to the trough to evacuate accumulated particles therefrom.

5. An apparatus for treating printed circuit boards, film and like articles having portions with polymer resist that is to be removed as solids by means of a resist stripping solution by spraying the solution on articles while the articles are conveyed along a path and filtering from the stripping solution the resist thus removed, wherein the apparatus comprises a treatment chamber, article conveying means in the chamber for conveying articles form an opening at one end to a discharge at the other end, spray nozzles in the chamber and disposed for spraying the stripping solution on the articles, and a collection zone in the chamber for collecting the stripping solution for recycling to said nozzles; said apparatus including:
 (a) at least one screen disposed at a sufficiently acute angle to the vertical to allow falling solution to pass therethrough while screening out resist particles and to allow the resist particles not passing through at least one screen to be washed along at least one screen;
 (b) at least one screen washing nozzle and being disposed generally at the upper end of at least one screen and washing resist particles along at least one screen;
 (c) a trough at the lower end of at least one screen, separate from said collection zone, for accumulating particles and solution washed along at least one screen; and
 (d) evacuating means connected to said trough, for evacuating solution and particles from said trough, including a filter connected to said evacuation means, for receiving the solution and particles from the trough, with the trough having a discharge line interconnecting said trough and chamber for delivering solution from the trough to means for returning said solution back to the chamber, and wherein said evacuation means includes propulsion means for periodically delivering a sufficient stream of solution to the trough to evacuate accumulated particles therefrom, and wherein the evacuation means further includes a discharge conduit from said trough, with valve means in said discharge conduit, and with means operationally connecting said valve means and said propulsion means whereby upon actuation of said propulsion means there is substantially simultaneously effected a setting of said valve means from a position of normal flow between said discharge line and said chamber, to an alternate position of flow between said discharge conduit and said filter, whereby accumulated particles are periodically delivered, by way of said discharge conduit to said filter.

6. The apparatus of claim 5, including a return line interconnecting said filter and chamber for returning filtered solution from the filter to the chamber.

7. An apparatus for chemically removing solid matter from articles being treated by a chemical treatment liquid, including a treatment chamber, article supporting means in an upper portion of said chamber for supporting articles being treated, means for delivering treatment liquid to spray means in said chamber for spraying onto articles supported therein for removal of solid matter from articles by the spray of the treatment liquid, and collection means at a lower portion of said chamber, for collecting treatment liquid for recycling to said delivery means, said apparatus including:
 (a) separating filter means disposed at a sufficiently acute angle to the vertical to allow falling treatment liquid to pass therethrough and to allow solid matter not passing through the filter means to be washed along the filter means;
 (b) filter washing means, for delivering treatment liquid across said filter means for washing solid material therealong;
 (c) a residence zone at a lower end of said separating filter means for receiving solids washed along the filter means, and distinct from said collection means; and (d) evacuation means for evacuating an evacuate of treatment liquid and solid material from said residence zone;

wherein said residence zone is defined by a trough for receiving solid material and treatment liquid, with the trough having a discharge line connected thereto comprising means for receiving treatment liquid flowing into the trough and delivering said liquid to means for recycling it back to the upper portion of said chamber, and wherein said evacuation means includes propulsion means for periodically delivering a stream of treatment liquid through the trough to evacuate accumulated solid material therefrom.

8. The apparatus of claim 7, wherein an additional filter means is provided, connected to said evacuation means for receiving the evacuate and filtering solid material from the treatment liquid therein, and wherein the evacuation means includes a discharge conduit from said trough, with valve means in said discharge conduit, and with means operationally connecting said valve means and said propulsion means whereby upon actuation of said propulsion means there is substantially simultaneously effected a setting of said valve means from a position of normal flow between said discharge line and said chamber, to an alternate position of flow between said discharge conduit and said additional filter means, whereby accumulated solid material is delivered, by way of said discharge conduit, to said additional filter means.

9. The apparatus of claim 8, including reverse flow means located in said chamber beneath said separating filter means, with means for supplying the reverse flow means with treatment fluid, and wherein said reverse flow means includes treatment liquid discharge means for discharging treatment liquid against the underside of said separating filter means to facilitate washing of solid material therefrom.

10. The apparatus of claim 8, including means for returning filtered treatment liquid derived from the evacuate, from said additional filter means, to the chamber.

11. An apparatus for treating printed circuit boards, film and like articles having portions with polymer resist that is to be removed by means of a resist stripping solution by spraying the solution on articles while the articles are conveyed along a path, wherein the apparatus comprises a treatment chamber, article conveying means in the chamber for conveying articles from an opening at one end to a discharge at the other end, spray nozzles in the chamber and disposed for spraying the stripping solution on the articles and a collecting zone in the chamber for collecting the stripping solution for recycling to said nozzles, said apparatus including:

(a) at least one screen disposed at a sufficiently acute angle to the vertical to allow falling solution to pass therethrough while screening out resist particles and to allow the resist particles not passing through the at least one screen to be washed along the at least one screen;

(b) at least one screen washing nozzle disposed generally at the upper end of the at least one screen for spraying the at least one screen and washing resist particles along the at least one screen;

(c) a trough at the lower end of the at least one screen, separate from said collection zone, for receiving resist particles and solution washed along the at least one screen; and (d) evacuation means connected to said trough, for evacuating solution and particles from said trough;

with the trough having a discharge line, said discharge line connecting the trough to the chamber for delivering solution back to the chamber, and wherein said evacuation means includes propulsion means for periodically delivering a sufficient stream of solution to the trough to evacuate accumulated particles therefrom.

12. The apparatus of claim 11, including a filter connected to said evacuation means, for receiving the solution and particles from the trough, and wherein the evacuation means further includes a discharge conduit from said trough, with valve means in said discharge conduit, and with means operationally connecting said valve means and said propulsion means whereby upon actuation of said propulsion means there is substantially simultaneously effected a setting of said valve means from a position of normal flow between said discharge line and said chamber, to an alternate position of flow between said discharge conduit and said filter, whereby accumulated particles are periodically delivered, by way of said discharge conduit, to said filter.

13. The apparatus of claim 12, including a return line connected to the filter and the chamber for returning filtered solution from the filter to the chamber.

* * * * *

UNITED STATES PATENT OFFICE
CERTIFICATE OF CORRECTION

Patent No. 4,784,169                    Dated November 15, 1988

Inventor(s) J. Walter Striedieck

It is certified that error appears in the above-identified patent and that said Letters Patent is hereby corrected as shown below:

Column 4, line 30, "135" should be "35".
Column 4, line 62, "particles" should be "solution".
Column 5, line 19, "56" should be "39".
Column 5, line 59, "56" should be "39".

Signed and Sealed this

Tenth Day of October, 1989

Attest:

DONALD J. QUIGG

Attesting Officer    Commissioner of Patents and Trademarks